(12) United States Patent
Solomon et al.

(10) Patent No.: US 7,870,176 B2
(45) Date of Patent: Jan. 11, 2011

(54) METHOD OF AND APPARATUS FOR IMPLEMENTING FAST ORTHOGONAL TRANSFORMS OF VARIABLE SIZE

(75) Inventors: Doron Solomon, Holon (IL); Gilad Garon, Jerusalem (IL)

(73) Assignee: ASOCS Ltd. (IL)

( * ) Notice: Subject to any disclaimer, the term of this patent is extended or adjusted under 35 U.S.C. 154(b) by 1182 days.

(21) Appl. No.: 11/176,149

(22) Filed: Jul. 7, 2005

(65) Prior Publication Data
US 2006/0010188 A1    Jan. 12, 2006

Related U.S. Application Data

(63) Continuation-in-part of application No. 11/071,340, filed on Mar. 3, 2005, now Pat. No. 7,568,059.

(60) Provisional application No. 60/586,390, filed on Jul. 8, 2004, provisional application No. 60/586,391, filed on Jul. 8, 2004, provisional application No. 60/586,389, filed on Jul. 8, 2004, provisional application No. 60/586,353, filed on Jul. 8, 2004, provisional application No. 60/604,258, filed on Aug. 25, 2004.

(51) Int. Cl.
*G06F 17/14* (2006.01)

(52) U.S. Cl. .................................................. 708/400

(58) Field of Classification Search ................ 708/400, 708/402, 404, 406, 408
See application file for complete search history.

(56) References Cited

U.S. PATENT DOCUMENTS

| | | | | |
|---|---|---|---|---|
| 3,783,258 | A * | 1/1974 | Chwastyk | 708/404 |
| 5,293,330 | A * | 3/1994 | Sayegh | 708/406 |
| 6,061,705 | A | 5/2000 | Hellberg | 708/408 |
| 6,098,088 | A * | 8/2000 | He et al. | 708/406 |
| 6,237,012 | B1 | 5/2001 | Ohgose | 708/401 |
| 6,735,167 | B1 | 5/2004 | Nawa et al. | 370/208 |
| 2003/0055861 | A1 | 3/2003 | Lai et al. | 708/620 |
| 2004/0243656 | A1 * | 12/2004 | Sung et al. | 708/404 |

OTHER PUBLICATIONS

Tell et al.,"A converged Hardware Solution for FFT, DCT, and Walsh Transform", IEEE, pp. 609-612, 2003.*

* cited by examiner

*Primary Examiner*—Chuong D Ngo
(74) *Attorney, Agent, or Firm*—McDermott Will & Emery LLP

(57) ABSTRACT

A reconfigurable architecture for and method of performing a fast orthogonal transform of vectors in multiple stages, the size of a vector being N, wherein N can vary and the number of stages is a function of N, the architecture comprising:
a computational unit configured and arranged so as to include one or more butterfly units; a block including one or more multipliers coupled to the output of the computational unit, configured and arranged so as to perform all of the butterfly computations for at least one stage of the transform; a storage unit configured and arranged so as to store the intermediate results of the butterfly computations and predetermined coefficients for use by the computational unit for performing each butterfly computation, the storage unit including memory and multiplexing architecture; the storage unit including memory and multiplexing architecture; a multiplexer unit configured and arranged so as to time multiplex all of the butterfly computations of the transform using said computation unit for the one stage so that only one computation unit is required for the stage; and a controller configured and arranged so as to provide coefficients to the computational unit, and control the sizes of memory and multiplexing architecture in the storage unit; wherein the multipliers' coefficients, the coefficients of the computational unit, the sizes of memories, and multiplexing architecture, for each stage are modified as a function of the value of N.

The architecture can be implemented as an integrated chip, and used in communication devices.

27 Claims, 15 Drawing Sheets

METHOD OF AND APPARATUS FOR IMPLEMENTING FAST ORTHOGONAL TRANSFORMS OF VARIABLE SIZE

RELATED APPLICATIONS

The present application claims priority from U.S. Provisional Application Ser. Nos.:

60/586,390, filed Jul. 8, 2004 and entitled Low-Power Reconfigurable Architecture for Simultaneous Implementation of Distinct Communication Standards;

60/586,391, filed Jul. 8, 2004 and entitled Method and Architecture for Implementation of Reconfigurable Matrix-Vector Computations;

60/586,389, filed Jul. 8, 2004 and entitled Method and Architecture for Implementation of Reconfigurable Orthogonal Transformations;

60/586,353, filed Jul. 8, 2004 and entitled Method and Architecture for Implementation of Reconfigurable Trellis-Type Coding; and 60/604,258, filed Aug. 25, 2004 and entitled A Method And Device For On-line Reconfigurable Vitter Decoding Of Recursive And Non-recursive Systematic Convolution Codes With Varying Parameters.

The following non-provisional U.S. application Ser. No.:

11/071,340, filed Mar. 3, 2005 and entitled Low-Power Reconfigurable Architecture For Simultaneous Implementation Of Distinct Communication Standards, now U.S. Pat. No. 7,568,059, of which the present application is a continuation-in-part application based thereon.

FIELD OF THE INVENTION

The disclosure relates to a system for and method of providing on-line reconfigurability of hardware so as to allow implementation of orthogonal transforms of vectors of varying size, such as FFT/IFFT (Inverse FFT) transforms, Walsh-Hadamard transforms, etc. including combinations of more than one type of such transform. The system and method are particularly useful in communication devices using such transforms.

BACKGROUND OF THE DISCLOSURE

Common orthogonal transforms provide a powerful tool in encoding information transmitted in wireless communication systems, and various ones of such transforms are used depending on the protocol used to transmit information. The FFT (Fast Fourier Transform)/IFFT (Inverse FFT), for example, is a critical computational block e.g. in OFDM systems and filter banks. See, for example, N. West, and D. J. Skellern, "VLSI for OFDM," IEEE Communications Magazine, pp. 127-31, vol. 36, (no. 10), October 1998, and R. van Nee and R. Prasad, OFDM for Wireless Multimedia Communications, Artech House Publishers, 2000.

An attractive feature of FFT/IFFT is that IFFT can be performed using a FFT block, by conjugating the input and output of the FFT and dividing the output by the size of the processed vectors. Hence the same hardware can be used for both FFT and IFFT. Several standard implementations of performing FFT/IFFT are known, some of which provide reconfigurability. One standard FFT/IFFT implementation is using FFT kernel arithmetic.

FFT Kernel Arithmetic:

The digital computation of the N-point DFT (discrete Fourier transform) (see, for example, A. V. Oppenheim and R. W. Schafer, Discrete-Time Signal Processing, Prentice Hill, N.J., 1989) is:

$$X[k] = \sum_{n=0}^{N-1} X[n] W_N^{nk}, k \in [0, N) \quad (1)$$

where the complex exponential coefficients are:

$$W_b^a = e^{-j2\pi \frac{a}{b}}.$$

Direct computation of DFT (for all k) requires N×N multiplications and N×(N−1) additions. FFT algorithms are more efficient implementations that reduce the number of multiplications to N log$_2$N. The basic idea is to divide the FFT of length N into two FFT components of length N/2, each of which is then further divided into two FFT components of length N/2, etc. This process continues until the length of each FFT component is reduced to 2, which can be computed directly by a so-called "butterfly" unit. The trellis of such a butterfly unit is illustrated in FIG. 1.

Two other commonly used FFT algorithms are decimation-in-frequency (DIF) and decimation-in-time (DIT) algorithm, which are similar in nature. The DIF algorithm is used to illustrate the architectural implementations where the FFT intermediate results are divided into even and odd parts with:

$$X[2r] = \sum_{n=0}^{N/2-1} x[n] W_N^{2rn} + \sum_{n=N/2}^{N-1} x[n] W_N^{2rn} \quad (2)$$

$$\sum_{n=0}^{N/2-1} x[n] W_N^{2rn} + \sum_{n=0}^{N/2-1} x[n+N/2] W_N^{2r(n+N/2)} \; r \in \left[0, \frac{N}{2}-1\right]$$

$$\sum_{n=0}^{N/2-1} \underbrace{(x[n] + x[n+N/2])}_{\text{Butterfly upper branch}} W_{N/2}^{rn}$$

and similarly, $$X[2r+1] = \sum_{n=0}^{N/2-1} \underbrace{(x[n] - x[n+N/2]) W_N^n}_{\text{Butterfly lower branch}} W_{N/2}^{rn}. \quad (3)$$

Standard Implementation:

In the standard prior art approach, to provide function-specific re-configurability it is first necessary to analyze the computational structure. The FFT can be viewed as a shuffle-exchange interconnecting network of butterfly blocks, which varies with the size of the FFT, thus making it difficult to support flexibility of the most energy-efficient fully-parallel implementation. In the fully parallel implementation the signal flow graph can be directly mapped onto hardware. For instance, for a 16-point FFT there are total of 32 butterfly units and they are interconnected in the manner as shown by the trellis in FIG. 2. In general, the N-point FFT requires $$\frac{N}{2} \text{Log}_2 N$$

butterfly units. This maximally parallel architecture has the potential for high performance and low power consumption, however it bears a high cost of large silicon area especially for large FFT sizes.

The outputs generated by DIF FFT are bit-reversed. For example, $X[10]=X[1010_2]=Y[0101_2]=Y[5]$.

When the implementation is done in fixed-point arithmetic the scaling and overflow handling are crucial for the correct behavior of the transformer. The butterfly operation at each stage of the FFT involves both complex addition and complex multiplication. Each complex addition is composed of two real additions, which expand the input word-length by 1 bit. Each complex multiplication is composed of four real multiplications and two real additions. A real multiplication doubles the input word-length. Thus to ensure the correct behavior, the output word-length is either increased to (M+1) bits, or the output needs to be truncated or rounded to M bits. If truncation is performed, the most significant bit of the output is simply discarded, by truncating the values to the maximum values that can be described by M bits. If rounding is performed, a "1" is added to the positive outputs first before the output is shifted to the right by 1 bit, and the least significant bit is discarded. Rounding will not cause adder overflow since the biggest and smallest numbers (a+b) have their least significant bit, after the addition, to be zero (even numbers). After rounding, the output will be in the same range as that of a and b, e.g., M bits.

Column Based Approach:

In a column-based FFT architecture, the computations are rearranged such that the interconnections are kept identical in every stage as shown by the trellis in FIG. 3. Since the inputs to a butterfly are no longer needed once the outputs are computed, the outputs can be routed to the inputs of the same butterflies, with the same butterflies thus being reused for the next and successive stages in iterative way (in-place computation). As a result, only a single column of butterflies is needed, the column being reused (time-multiplexed) by the different stages of computation. The FFT coefficients, however, need to be changed from stage to stage. In general, an N-point FFT needs N/2 butterfly units, e.g. 8 butterflies are needed for a 16-point FFT. Its power consumption is very close to the a fully parallel architecture, but it requires less area. Still to convert it to a reconfigurable design is a complicated task, since the simple iterative structure is optimized for a specific size. The transition from a parallel to a column based implementation requires more clocks for processing an FFT frame. Indeed the parallel approach allows processing of a full FFT frame in one clock cycle, while the column approach needs $\log_2 N$ (when using a radix-2 based butterfly architecture) clock cycles due to the iterative time-multiplexed structure.

Reconfigurable Design:

By choosing a regular pipelined architecture to run an FFT algorithm, it is possible to implement a reconfigurable design with very low energy overhead even compared with the one provided by the standard lower boundary of the complexity of a FFT transform.

Pipelined Approach:

In the regular pipelined architecture, only one butterfly unit is used for each stage, yielding the total complexity $\log_2 N$, compared to $N/2 \times \log_2 N$ in the fully-parallel approach and N/2 in the column-based approach. An example of the pipeline approach is illustrated in FIG. 4 for the length of a 16-point FFT. The multiplier 40 of each stage 42a, 42b and 42c is distinguished from the butterfly unit 44a, 44b and 44c to distinguish between hardware requirements. Each of the butterfly units 44a, 44b, 44c and 44d is time-multiplexed among the N/2 butterfly computations for each stage. For the stage including the butterfly unit 44c, the multiplier 40c is "j". No multiplier is necessary for the out of the final butterfly unit 44d. The pipelined-based implementation needs more clock cycles per FFT frame than the column-based approach since the pipelined-based approach can implement a full FFT frame in N (when using radix-2 based butterfly architecture) clock cycles, while the column approach needs $\log_2 N$ (when using radix-2 based butterfly architecture) clock cycles due to the iterative time-multiplexed structure. In hardware implementation of all stages the clock number for processing an FFT frame is not an obstacle since the data is inserted in a serial manner, frame by frame, and the number of clock cycles per frame is transformed into a constant initial delay, while the throughput remains high.

The single-path delay feedback (SDF) implementation, see, for example, E. H. Wold and A. M. Despain, "Pipelined and parallel-pipeline FFT processors for VLSI implementation," IEEE Trans. Comput., p. 414-426, May 1984, uses memory more efficiently by storing the butterfly outputs in feedback shift registers or FIFO's 46 (their sizes are given in FIG. 4, in the example the lengths of the registers are 8, 4, 2, and 1, correspondingly). A single data stream passes the multiplier at every stage.

Hybrid Approach

The hybrid approach combines benefits of the column and feedback approaches. It uses elements of the feedback approach to save memory, and the column stages are used for better hardware utilization. Use of the column stage butterfly units of 4 bits' width can be combined with employing a greater BUS width and proper reconfigurable multipliers. The architecture can also be converted to one with an exact BUS width necessary for high space utilization and algorithmic efficiency.

A popular architecture for running an iterative process is shown in FIG. 5. This FFT implementation utilizes a single butterfly unit 50. The single butterfly unit design is mainly focused on optimizing a scheduling and memory access scheme, i.e., providing a pipeline approach when implementing each of the stages by reusing the same butterfly unit, time-multiplexed in an iterative way. The Spiffee processor, see for example, B. M. Baas, "A Low-power, high-performance, 1024-point FFT processor," IEEE Journal of Solid-State Circuits, March 1999, is an example of using cached memory architecture, including RAM 52 and multiplier 56, to exploit the regular memory access pattern of a FFT algorithm in order to achieve low power consumption. The processor, shown as controller 54, can be programmed to perform any length of FFT, but certain features, such as cache sizes provided by RAM 52, are optimized only for a certain FFT size, and this approach operates at very low speeds because the N clock cycles needed for the computation of a FFT frame through the full implementation of the pipeline algorithm, yielding a constant initial delay. This means that due to the iterative time-multiplexing of the stages by the reused butterfly unit 50, the full frame needs to be computed (needs N clock cycles when using a radix-2 based butterfly unit) before it can begin to handle the next FFT frame.

One can make a more efficient FFT processor by using a larger radix-based butterfly unit, e.g. the Radix-4 based architecture. This reduces the computation clock cycle that is needed for processing a full FFT frame to N/2. Most of the FFT accelerators that are implemented in advanced DSPs and chips are based on the Radix-2 or Radix-4 FFT processors. They have a limited usage (only for FFTs transforms), very low speed utilization and suffer from the need of high clock rate design.

Filter Implementation Based on Multiplex Pipelined Approach:

Using reconfigurable iterative schemes, such as the one shown in FIG. 6, one can implement any kind of filter or correlation function with high efficiency. It is achieved by using the multiplier of the last stage of a FFT transform for multiplication by a filter coefficient (time domain multiplication) followed by an IFFT as best seen in FIG. 6 at 60. It is also efficient in implementing any sub-product of a FFT/IFFT, e.g. Discrete Cosine/Sine Transforms (DCT and DST), and any algorithms which are a combination of the above-mentioned algorithms, like filtering using cascaded FFT and IFFT algorithms (which can be used also for equalization, prediction, interpolation and computing correlations).

FFT with Different Radixes:

The radix-$2_2$ algorithm is of particular interest. It has the same multiplicative complexity as radix-4 and split-radix algorithms respectively, while retaining a regular radix-2 butterfly structure. This spatial regularity provides a great structural advantage over other algorithms for VLSI implementation. The basic idea behind the radix-$2_2$ algorithm is in taking two stages of the regular DIF FFT algorithm and maximizing the number of trivial multiplications by $$W_N^{\frac{N}{4}} = -j,$$

which involves only real-imaginary swapping and sign inversion. In other words, the FFT coefficients are rearranged and non-trivial multiplications are lumped into one stage so that only one complex multiplier is needed in every two stages (reduces the overall logic area). FIG. 7 illustrates a trellis representing such a coefficient rearrangement (in parallel form): for any two butterfly coefficients $$W_N^i \text{ and } W_N^{i+\frac{N}{4}}, W_N^i$$

is factored out and forwarded to the next stage, which leaves the coefficients 1 and $-j$ in the corresponding positions. After performing this coefficient rearrangement over all the coefficient pairs, one stage is left without non-trivial multiplication.

Hybrid Pipeline/Multiplex Approach:

A number of pipelined FFT architectures have been proposed over the last decade. Since the spatial regularity of the signal flow graph is preserved in pipelined architectures, they are highly modular and scalable. The shuffle network 80 is implemented through a single-path delay feedback depicted in FIG. 8A, where the data is processed between stages 82 in a single path and feedback FIFO registers 84 are used to store new inputs and intermediate results. The basic idea behind this scheme is to store the data and scramble it so that the next stage can receive data in the correct order. When the FIFO registers 84 are filled with the first half of the inputs, the last half of the previous results are shifted out to the next stage. During this time, the operational elements are bypassed. When the first half of the inputs are shifted out of the FIFO registers, they are fed into the processing elements along with the arriving second half of inputs. During this time, the operational elements are working and generating two outputs, one directly fed to the next stage 82 and the other shifted into the corresponding FIFO registers. Multipliers (not shown) are inserted between stages when necessary according to either the radix-$2_2$ or the radix-2 algorithm. A trellis and data packets for use in such an implementation is illustrated in FIGS. 8B and 8C, respectively.

BRIEF DESCRIPTION OF THE DRAWINGS

Reference is made to the attached drawings, wherein elements having the same reference character designations represent like elements throughout, and wherein.

DETAILED DESCRIPTION OF THE DRAWINGS

The following disclosure describes a method of and system for implementing orthogonal transforms, such as Fast Fourier Transforms (FFTs) of vectors having varying size (real and complex vectors). Adaptive algorithms are implemented where the size of the transform can be determined on line and is dependent on the input to the algorithm. Examples of such adaptive algorithms are (1) FFTs, (2) inverse FFT (IFFTs), (3) any sub-products of FFTs and IFFTs, e.g. Discrete Cosine/Sine Transforms (DCT and DST), (4) Walsh-Hadamard transforms and any its' sub-products, e.g. CDMA, DSSS, Spreading/De-spreading core algorithms, and any combination of the algorithms mentioned above. The method and system can also be used for filtering and other functions, such as achieved when cascading FFT and IFFT algorithms (which in turn can be used also for equalization, Hilbert transforms, predictions and interpolations and correlations). The method and system allows implementation of FFT/IFFT and all the above-mentioned algorithms with high efficiency and in a wide range of parameters by fast on-line reconfiguration of hardware. It provides a significant decrease in the amount of hardware in devices which are intended for parallel or serial implementation of several FFT transforms or algorithms mentioned above of different sizes.

The disclosed approach is to modify an orthogonal transform processor so as to provide a simplified interconnection structure that makes it easy to achieve flexibility by adapting to the length of the FFT vectors and sizing the memory accordingly, e.g., changing the length of the shift registers (or FIFO's), modifying the interconnecting buses as needed, and providing simple multiplexing of I/O blocks. With a clock frequency at the input sample rate the entire range of FFT's can be accommodated by either direct mapping to hardware and disabling unnecessary blocks for the shorter length FFT's or by folding the processing stages and time-sharing the hardware for the longer (but lower symbol rate) cases. This architecture does not need buffering or serial-to-parallel conversion.

Figure 9:
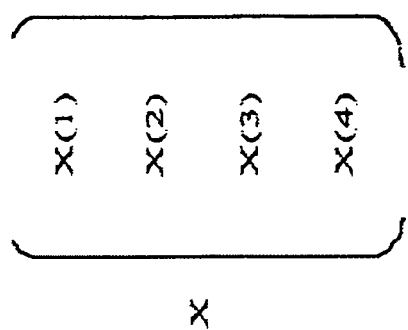
FIG. 9 is an illustration of a matrix operation for use in a radix-4 butterfly architecture in accordance with one aspect of the method and system of the present disclosure.
Figure 9:
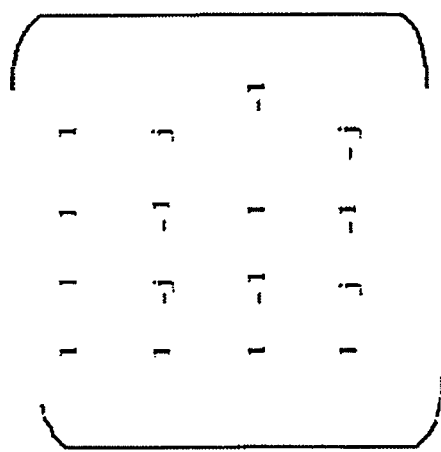
Figure 9:
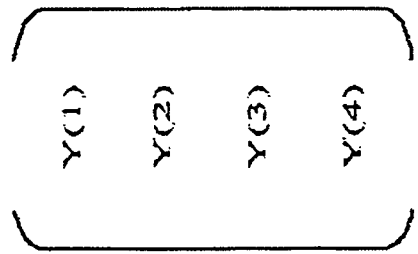
Figure 10:
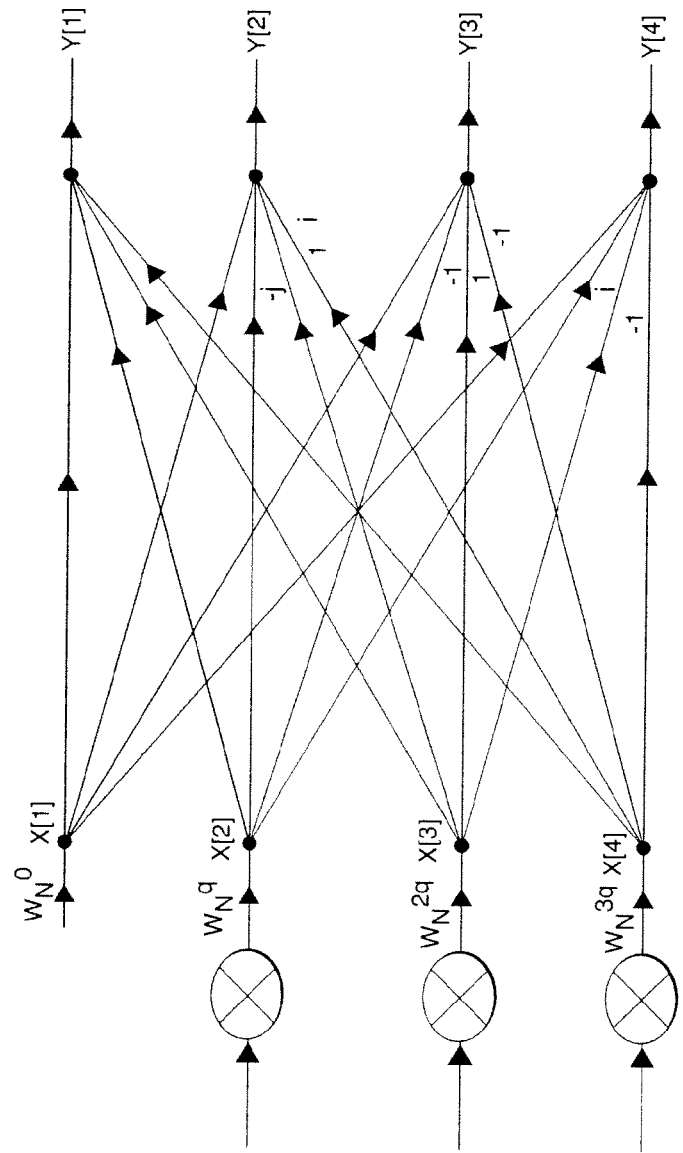
FIG. 10 is an illustration of a radix-$2_2$ stage trellis in accordance with one aspect of the method and system of the present disclosure.

The architecture can be implemented using according to Radix2, Radix$2_2$, Radix$2_3$, Radix4, Radix 8, or similar format. The radix-4 (without the Twiddle coefficients' multipliers) can be represented also as a matrix operation as shown in FIG. 9, and implemented as shown by the trellis in FIG. 10.

Figure 11:
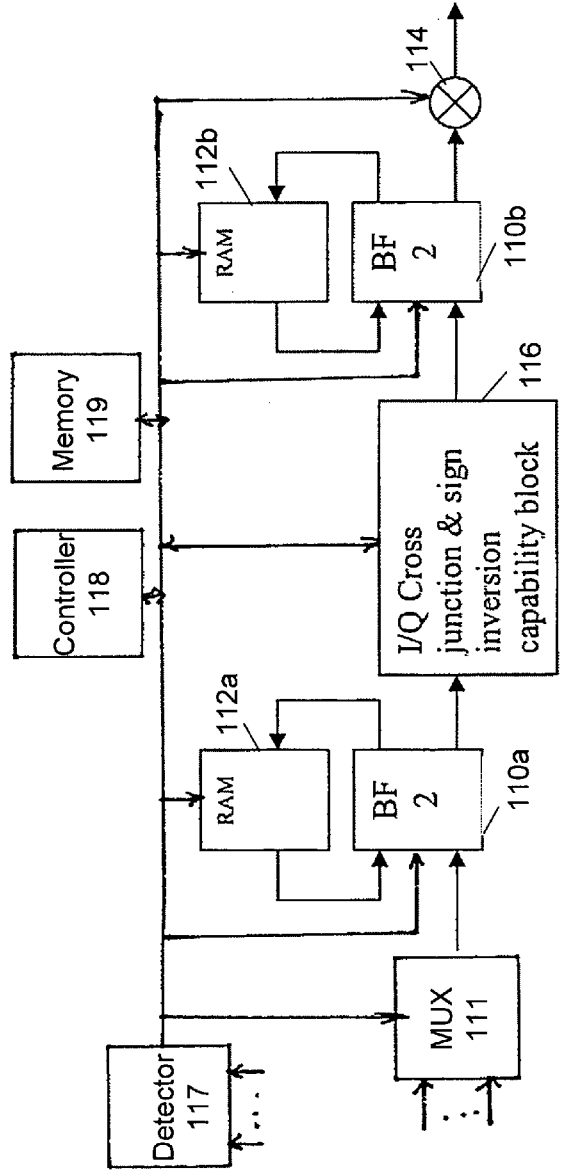
FIG. 11 is an illustration of a block diagram of an architecture of a reconfigurable Radix-$2_2$ stage butterfly arrangement in accordance with one aspect of the method and system of the present disclosure.

An embodiment of a reconfigurable radix $2_2$ stage implementation, illustrated in FIG. 11, comprises in input multiplexer 111, two stages of butterfly units 110a and 110b, two feedback memories 112a and 112b with only one general multiplier 114 and one cross junction (with sign inversion capability) block 116, and a controller 118. The block 116 is used to switch between IFFT and FFT processing, thus eliminating the need for a multiplier at the output of the butterfly unit 110a. In implementation, the size of the usable memory of memories 112a and 112b can be modified by the controller 118 to accommodate the length of the FFT being processed. The length of the transform vectors can be detected by detector 117 and determined by controller 118. In addition memory 119 is provided for storing coefficients for use by the multiplier 114 for each stage of calculation.

Figure 12:
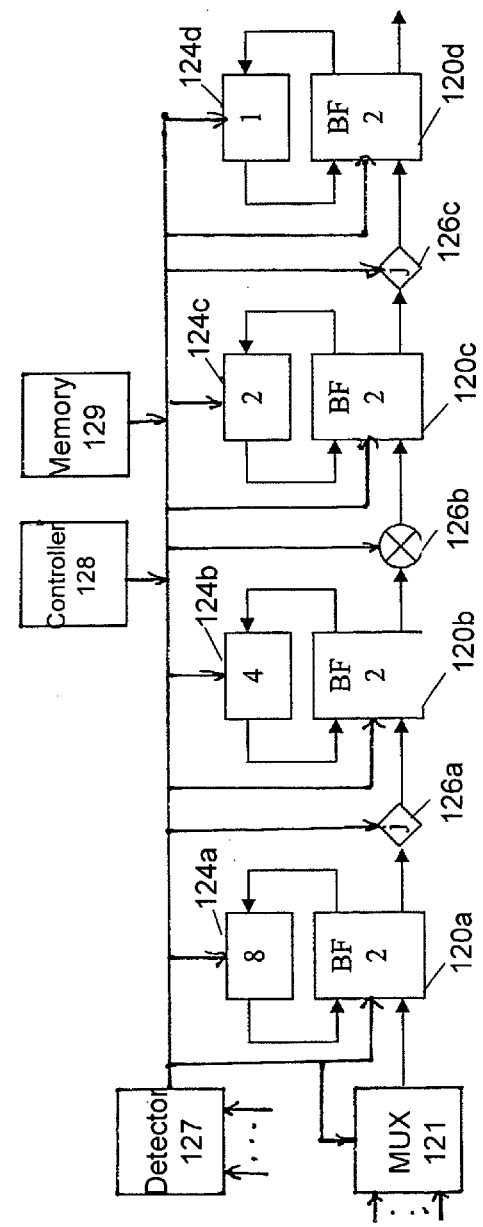
FIG. 12 is an illustration of a pipeline-based Radix-2 (N=16) 16-point filter in accordance with one aspect of the method and system of the present disclosure.

FIG. 12 illustrates an embodiment of a pipelined Radix-$2_2$ (N=16) based implementation of a 16 point FFT. In this embodiment, the controller 128 provides an input to set the size of each of the memories, in this case shift registers 124 for each stage. The multiplexer 121 is also set to provide the desired sequential inputs to the input the butterfly unit 122a of the first stage. The multipliers 126a, 126b and 126c are separately positioned at the output of each of the first three stages, with the final stage not requiring one. As seen the multipliers 126a and 126c convert the output of the stages to which the are coupled to an imaginary complex "j", by multiplying by "j".

Figure 13:
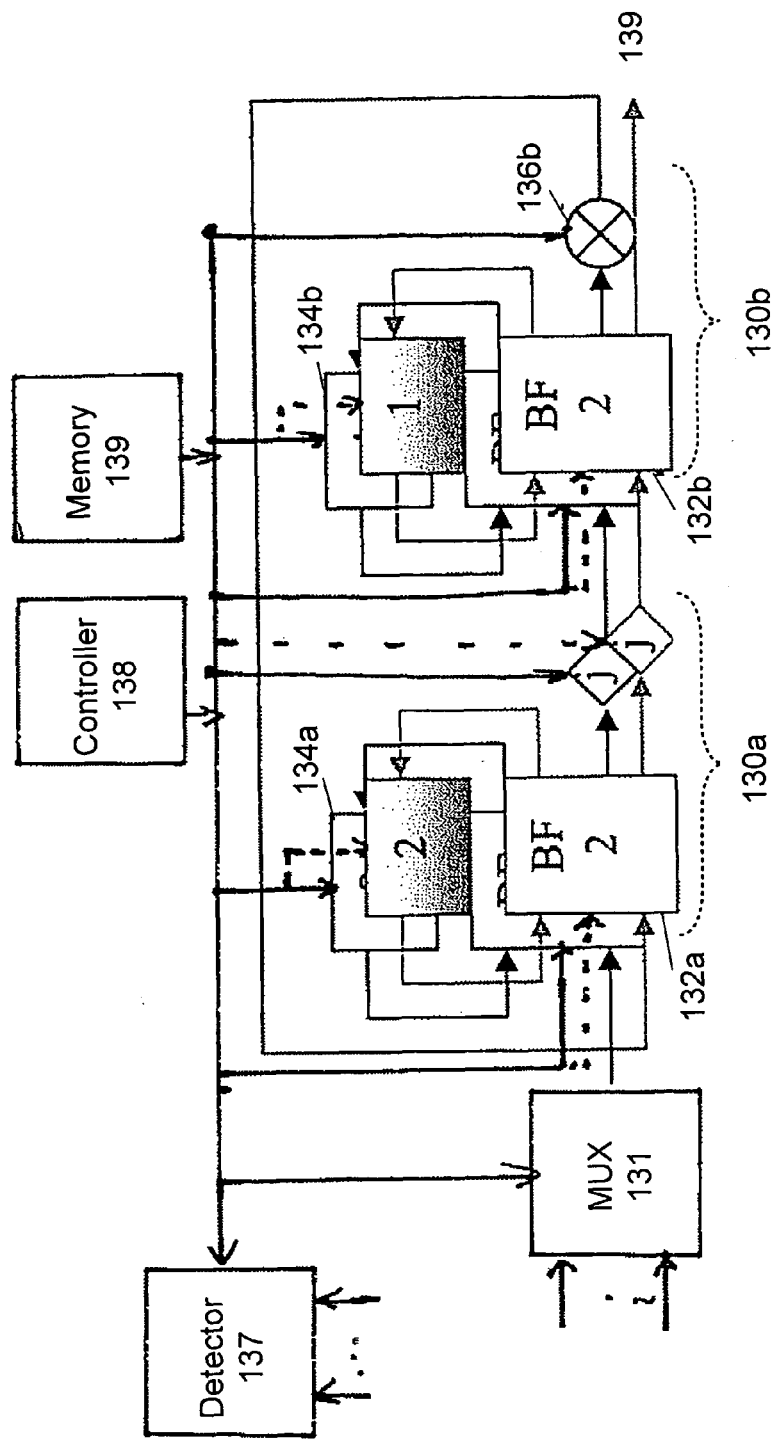
FIG. 13 is an illustration of a semi pipeline/iterative Radix-$2_2$ (N=16) based implementation of 16-point FFT in accordance with one aspect of the method and system of the present disclosure.

An alternative embodiment is shown in FIG. 13 which incorporates an architecture for carrying out an iterative process. Specifically, FIG. 13 shows an example of a semi-pipeline/iterative Radix-$2_2$ (N=16) based implementation of processing a 16 point FFT. In this embodiment, only two butterfly stages 130a and 130b are required with the output of the multiplier 130b providing feedback, as well as the output of the transformation processor. Specifically, the output of the multiplexer 131 is provided to the input of the butterfly unit 132a. The latter provides feedback to the memory (e.g. shift register 134a, and an output to the "j" multiplier 136a. The output of the "j" multiplier 136a is applied to the input of the butterfly unit 132b. The latter provides feedback to the memory (e.g., shift register 134b), and an output to the multiplier 136b. The output 136b is connected through a feedback path to the input of the butterfly unit 132a. In operation, controller 138 controls the size of the memories 134 depending to the stage of the processing. In the first instance when the signal vectors are first received, the registers 134a and 134b are set at "8" and "4" respectively, and the signals processed through the two stages. The output of the processor is disabled and the output of the second stage butterfly unit 132b is applied through the feedback path to the input of the butterfly unit 132a. During the next iteration, the memories are set by the controller to "2" and "1". The signals are then serially processed through to the output of the second butterfly unit 132b. The output of the processor is then enabled, and the feedback path disabled so that the output of the processor is provided at 139.

Figure 14:
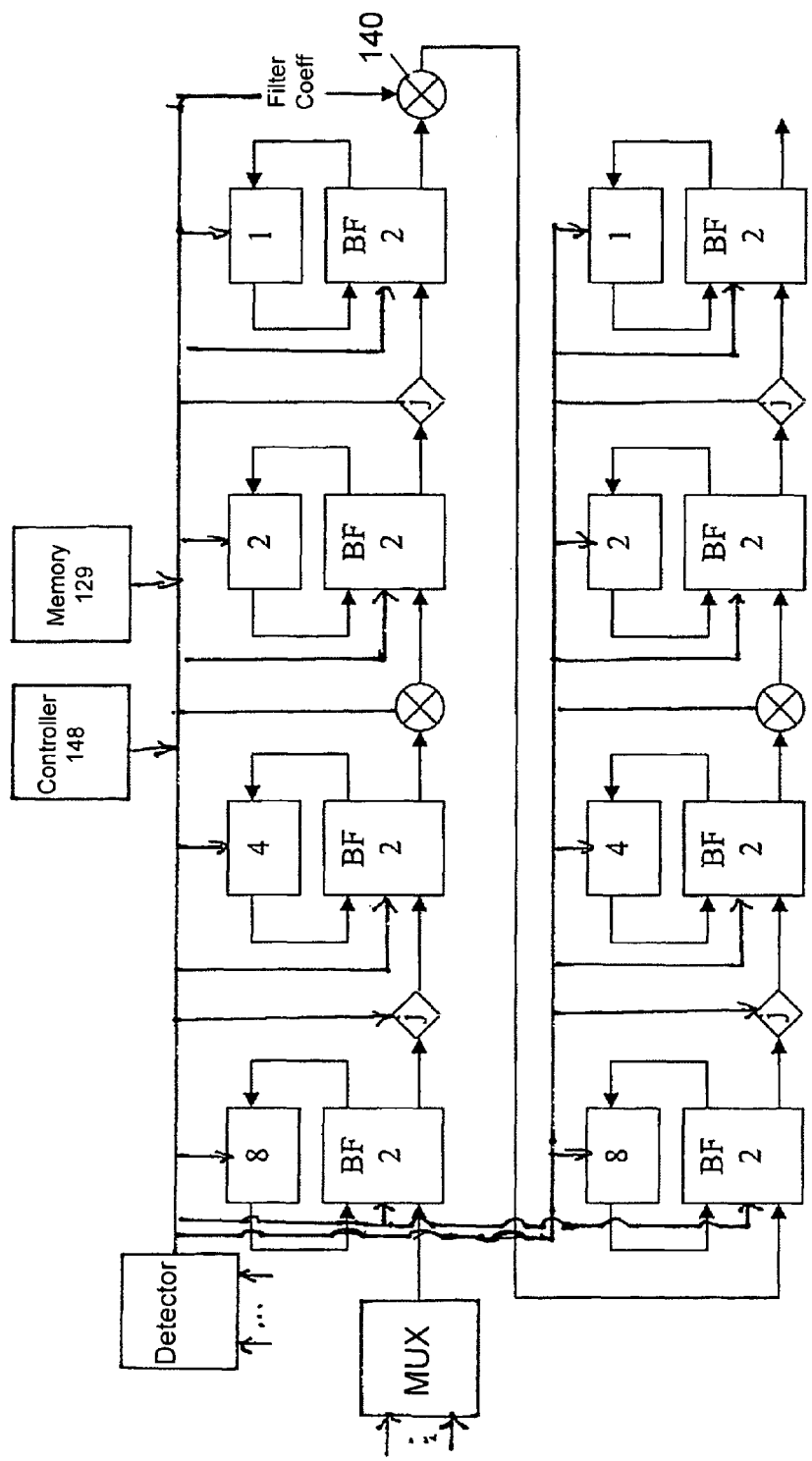
FIG. 14 is an illustration of a pipelined Radix-$2_2$ (N=16) based implementation of a 16 point filter in accordance with one aspect of the method and system of the present disclosure.

FIG. 14 illustrates an embodiment of an example of a Pipeline Radix-$2_2$ (N=16) based implementation of a 16 point filter. Again the sizes of memories are set for each stage by the controller 148. The filter coefficients are applied to the multiplier 140. The architecture can be iterative or a mixture of pipeline/iterative or parallel.

Again the architecture of FIG. 14 can be modified to be interative or a mixture of pipeline/iterative or parallel architecture.

Walsh-Hadamard Transformations Enabling:

From the previous discussion regarding a radix-4 transform as a matrix operation, it is easy to see that the architecture can be easily changed to process other orthogonal signaling, such as Walsh Spreading/Despreading functions The latter can be easily implemented with the existing architecture by simply substituting multiplier coefficients by trivial ones of ±1. Further examination shows that only the non-trivial coefficients and the coefficients which are multiplied with −j, need to be changed. Moreover, the non-trivial multiplier coefficients have already all that is necessary for implementation of the trivial multipliers needed for the Walsh Spreading/Despreading function, the ability to change between FFT↔IFFT and multiplication by −j. The only extra requirement for the hardware is in managing the controller 148.

As an example, the "Radix 4" Walsh Spreading/De-spreading butterfly unit can be represented as a matrix operation as follows:

$$\begin{pmatrix} Y(1) \\ Y(2) \\ Y(3) \\ Y(4) \end{pmatrix} = \begin{pmatrix} 1 & 1 & 1 & 1 \\ 1 & -1 & 1 & -1 \\ 1 & 1 & -1 & -1 \\ 1 & -1 & -1 & 1 \end{pmatrix} \times \begin{pmatrix} X(1) \\ X(2) \\ X(3) \\ X(4) \end{pmatrix} \quad (4)$$

One can see the relation between the two transforms by comparing the two matrix presentations:

$$\text{Walsh} \begin{pmatrix} 1 & 1 & 1 & 1 \\ 1 & -1 & 1 & -1 \\ 1 & 1 & -1 & -1 \\ 1 & -1 & -1 & 1 \end{pmatrix} \Leftrightarrow \begin{pmatrix} 1 & 1 & 1 & 1 \\ 1 & -j & -1 & j \\ 1 & -1 & 1 & -1 \\ 1 & j & -1 & -j \end{pmatrix} FFT \quad (5)$$

Since the radix-4 transform is a complex operation, one obtains two independent Walsh spreading/de-spreading processes for the real vectors since the trivial multipliers by ±1 do not interchange between the I and the Q signals. Therefore, this feature can be used for implementing, for example, a two fingers' RAKE receiver or a complex Walsh spreading/de-spreading function as in the new WCDMA standards. One can also use the second independent Walsh Spreading/De-spreading function as an extra stage, or alternatively, use them for greater Walsh Spreading/De-spreading by conjured I and Q at the proper place (this possibility is already implemented in the reconfigurable Radix $2_2$ architecture shown in FIGS. 9-14).

The implementation presented in FIG. 14, for example, requires a FFT algorithm which is carried out with only N Log(N) operations, and, thus is very efficient for such operations as CDMA modulation/demodulation of several codes together, i.e., for a heavy data load.

The complex multipliers now can be used in implementation of filters in the frequency domain for randomizing/de-randomizing the Walsh sequence with quasi-random sequences with very high efficiency (when dealing with CDMA modulation/demodulation of several codes together, i.e. for a heavy data load (as can be seen in CDMA/WCDMA standards). The efficiency is achieved due to the fact that one needs to multiply the modulated data only once (for all the codes) and not every code is multiplied separately.\

Figure 15:
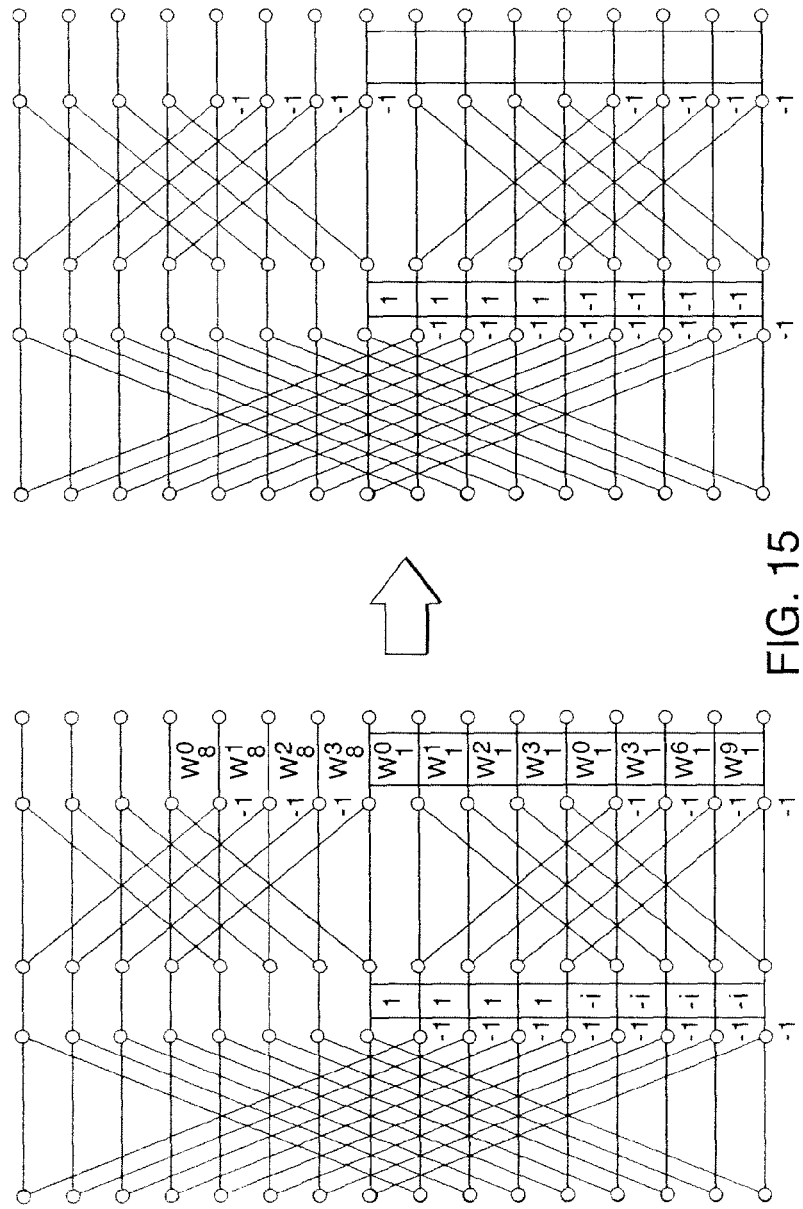
FIG. 15 is an illustration of a trellis of a parallel Radix-$2_2$ (N=16) based implementation of a 16 point Walsh spreading/dispreading function in accordance with one aspect of the method and system of the present disclosure.

FIG. 15 illustrates a trellis of an example of an embodiment of the transformation of a radix-4 stage to Walsh spreading/de-spreading function when Twiddle multipliers for randomizing Walsh codes are used in the beginning and the end of a parallel architecture. FIG. 15 specifically shows an example of a parallel Radix-$2_2$ (N=16) based implementation of a 16 point Walsh spreading/dispreading function.

Figure 16:
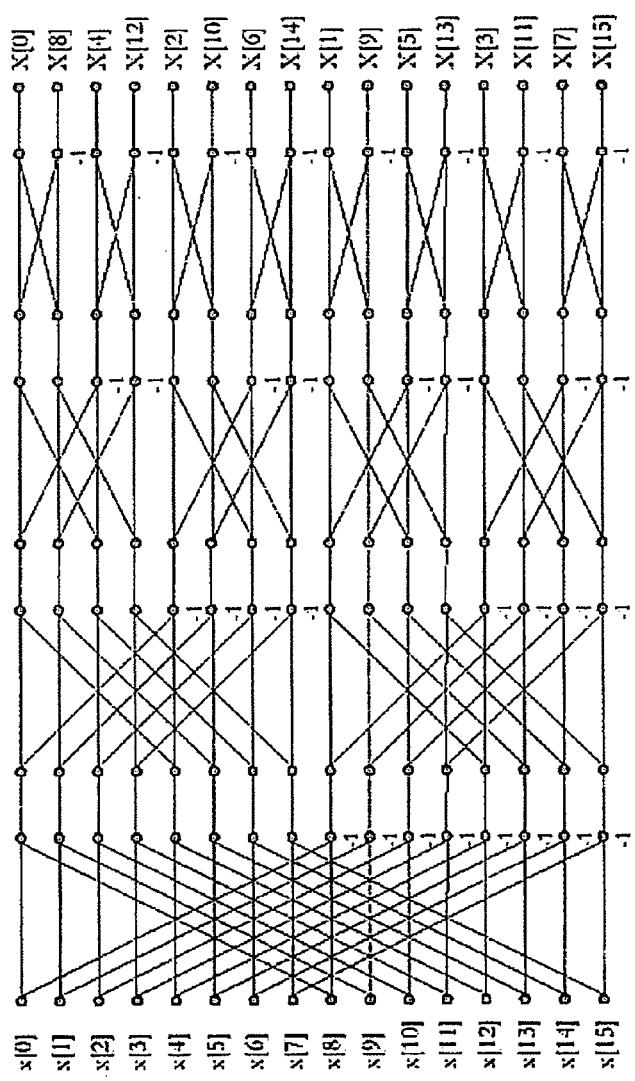
FIG. 16 is an illustration of a trellis of a parallel Radix-2 (N=16) based implementation of a 16 point Walsh spreading/dispreading function in accordance with one aspect of the method and system of the present disclosure.

Implementing a radix-2 base FFT using Twiddles multipliers, the multipliers can be changed to "1"s only. FIG. 16 shows an example of a trellis of parallel Radix-2 (N=16) based implementation of 16 points, Walsh spreading/de-spreading sequence, i.e., an example of a sequence of 16 chips of a Walsh Spreading/De-spreading sequence during modulation/demodulation.

Again, complex multipliers can be used as explained above, e.g. for implementation of filters in the frequency domain, or for randomization/de-randomization of the Walsh sequences with quasi-random sequences. Efficiency is achieved due to the fact that one needs to multiply the modulated data only once (for all the codes), and thus each code need not be multiplied separately.

Figure 17:
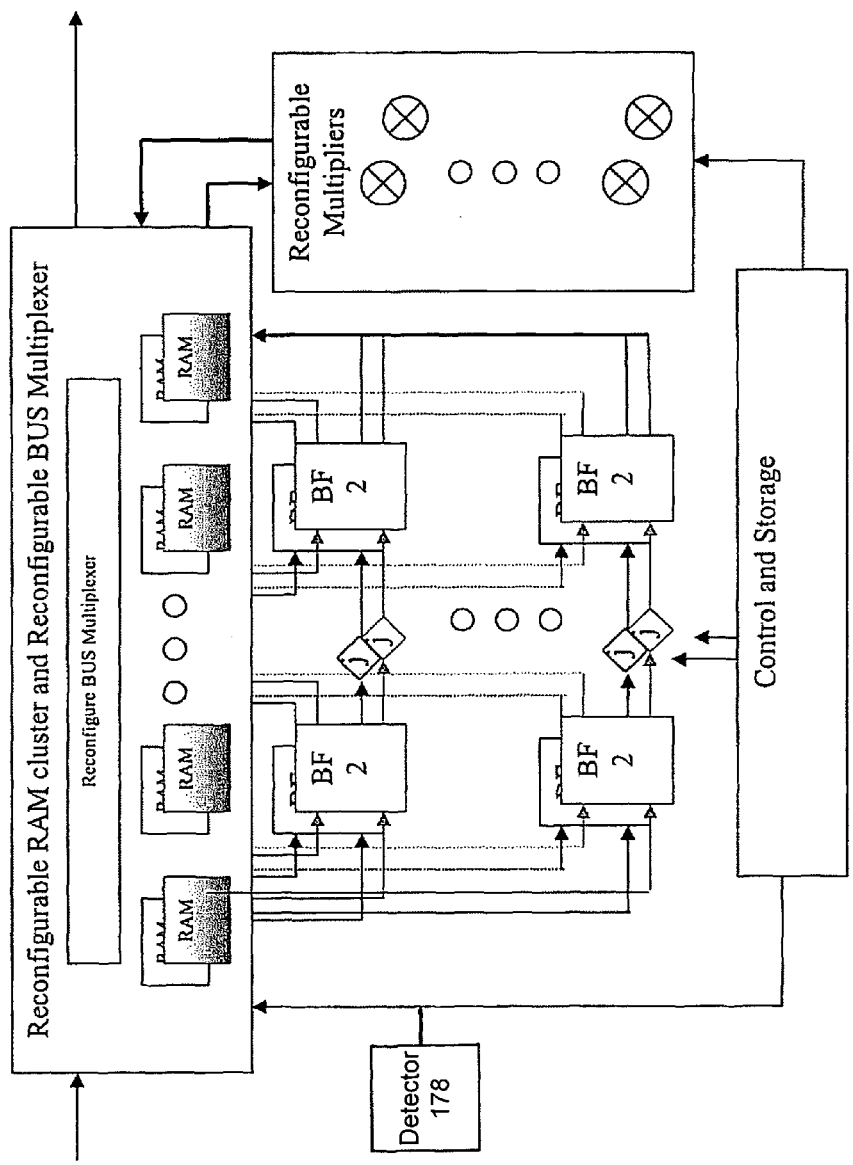
FIG. 17 is an illustration of a block diagram of an architecture of providing a reconfigurable MF-I core processor in accordance with one aspect of the method and system of the present disclosure.

Reconfigurable Hybrid Pipeline Column Multiplex Approach:

As shown in FIG. 17, A "bank" of small radix$2_2$ butterfly units of 4 bits' width can be combined to form wider BUS radix$2_2$, with each of the small Radixes connected to a reconfigurable controlled "Bank" of RAMs that can be combined/split. Reconfigurable multipliers for BUS splitting can also be implemented based on the above methodology using a reconfigurable "processing" core with very high utilization and low power consumption of any length of IFFT/FFT/filter/correlator and Walsh-Hadamard transformations or any sub product of it e.g., a CDMA DSSS core or even a DDS frequency filter, with any BUS width necessary when several algorithms can run in any configuration, including a variety of parallel/pipeline/iterative algorithmic architecture schemes. Since the implementation of the core in silicon has a maximum clock rate, reconfiguration according to the needs can result in any number of parallel/pipeline/iterative algorithmic architecture schemes, each optimized for the algorithms and the silicon implementation resources at any time, and for any standard of modem implementation, thus resulting in a very compact reconfiguration architecture with high utilization performance. FIG. 17 shows an example of a reconfigurable MF-I core for processing FFT/IFFT vectors.

Summarizing the disclosure, the current approach includes modification of the basic FFT processor by using a simplified interconnection structure. This allows flexibility in adjusting for the size of the FFT simply by changing the length of the shift registers (or FIFO's) of the memory, changing the bus sizes as needed, and simple multiplexing of the I/O blocks. With a clock frequency at the input sample rate, the entire range of the FFT's can be accommodated by either direct mapping to hardware and disabling unnecessary blocks for the shorter length FFT's, or by folding the processing stages and time-sharing the hardware for the longer (but slower symbol rate) cases. This architecture does not require buffering or serial-to-parallel conversion.

Figure 1:
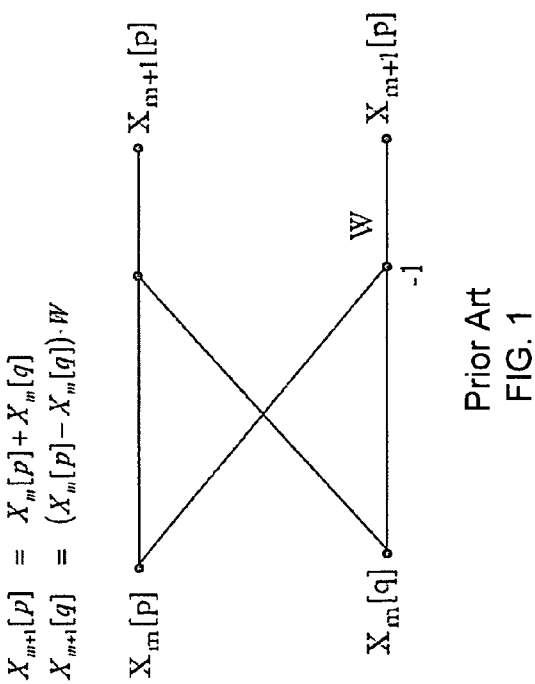
FIG. 1 is an illustration of a FFT butterfly computation trellis.
Figure 2:
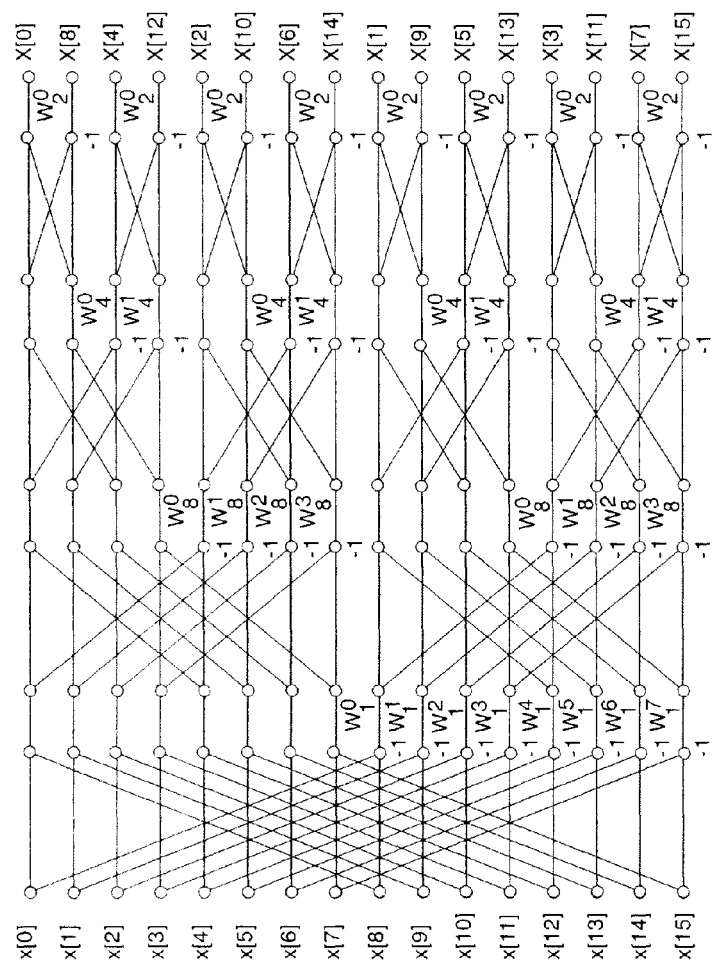
FIG. 2 is an illustration of a decimation-in-frequency 16-point FFT trellis.
Figure 3:
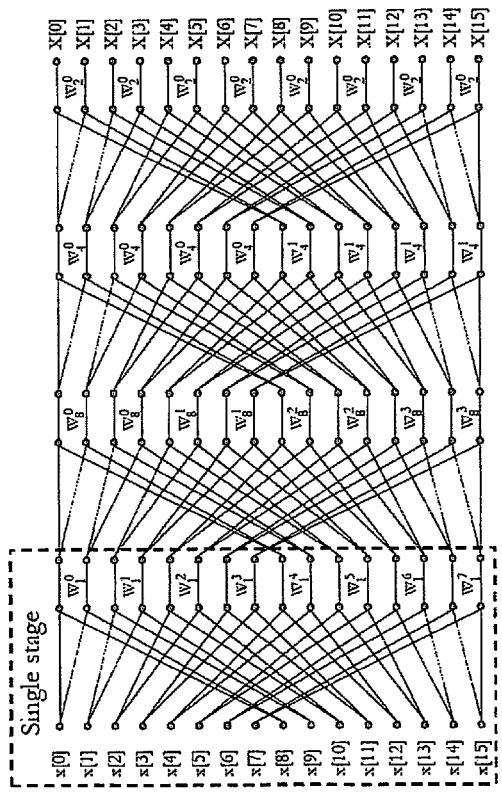
FIG. 3 is an illustration of a Column-based 16-point FFT trellis.
Figure 4:
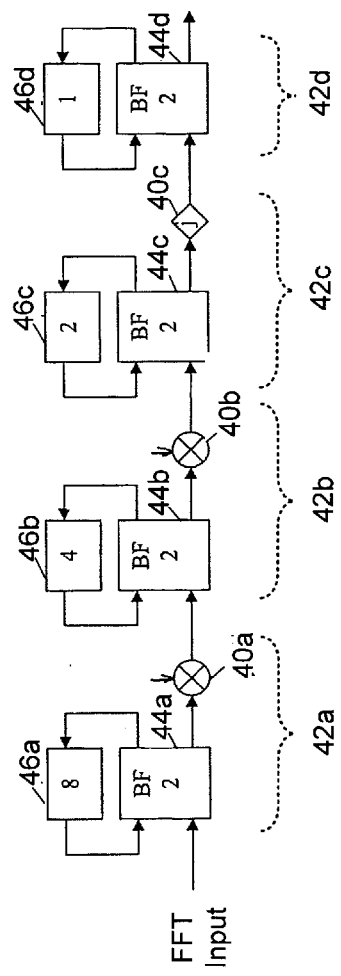
FIG. 4 is an illustration of a block diagram of an architecture for implementing a pipeline-based Radix-2 (N=16) 16-point FFT.
Figure 5:
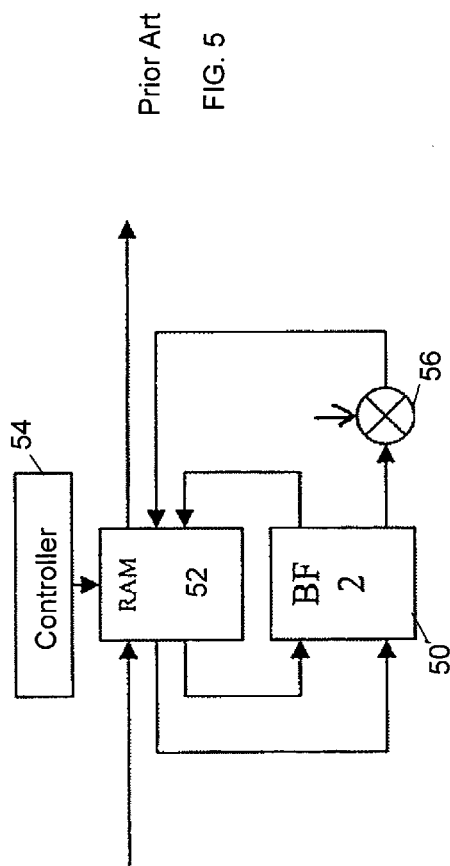
FIG. 5 is an illustration of a block diagram of an architecture for implementing a simple Radix-2 FFT processor.
Figure 6:
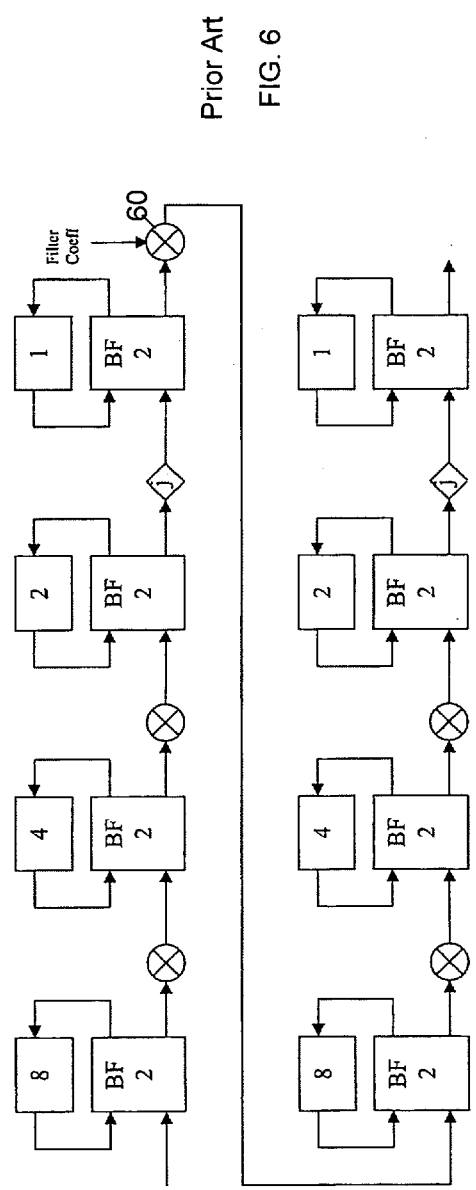
FIG. 6 is an illustration of a block diagram of an architecture of a pipeline-based Radix-2 (N=16) 16-point filter.
Figure 7:
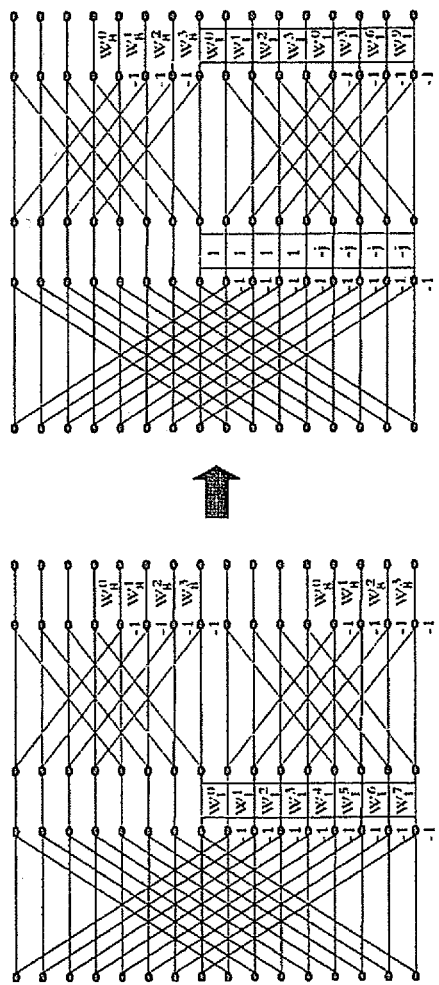
FIG. 7 is an illustration of a trellis of a multiplication elimination technique through coefficient rearrangement.
Figure 8:
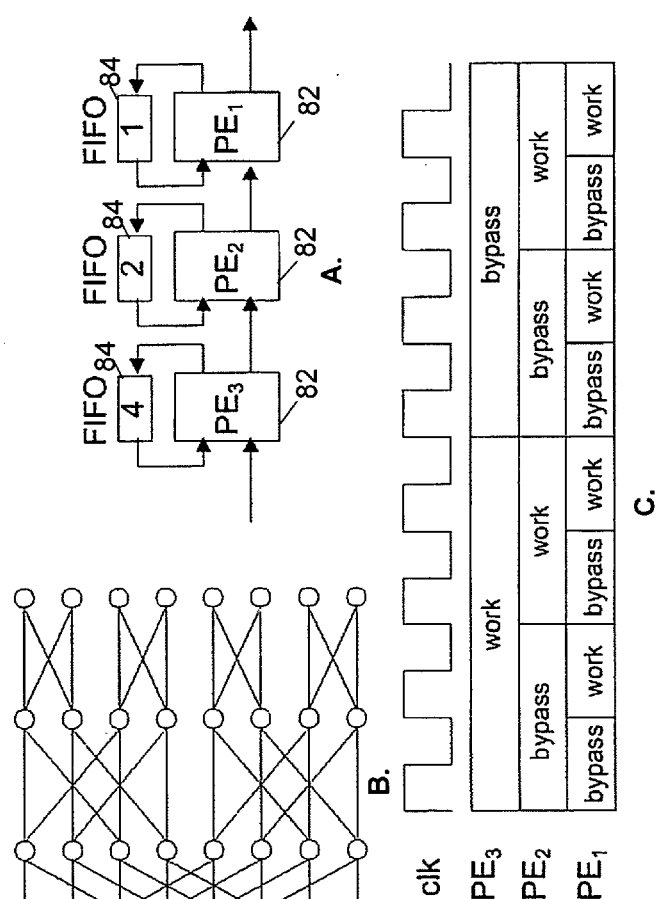
FIG. 8 is an illustration of a trellis, block diagram and packet diagram of a pipelined implementation of a shuffle-exchange interconnect transformer.

Using a Radix$2_2$ architecture as an example, the radix-4 (without the twiddle coefficients' multipliers) can be represented also as a matrix operation as seen in FIG. 9. The corresponding butterfly structure is presented in FIG. 10. Thus, as shown in the above example, a radix $2_2$ stage implementation will need two stages of butterfly units with only one general multiplier and one cross junction (also needed for IFFT/FFT changing) with sign multiplication, and thus eliminating the need for a multiplier. The corresponding structure is presented in FIG. 11. The corresponding multistage implementation (cf. with FIG. 4) of Radix$2_2$ implementation of the a 16 point FFT is given in FIG. 12. The same transform, but implemented using iterative reconfigurable switch mechanism is presented in FIG. 13 (one stage) and FIG. 14 (multi-stage).

Walsh-Hadamard transformations enabling: The processor and method thus described in connection with FFT/IFFT can also be used to implement a processor and method for other transforms. From the above presentation of a radix-4 transform as a matrix operation, in order to change the operation to Walsh spreading/despreading function, all that is required is to substitute the multipliers used for the FFTs by trivial multipliers of ±1. Further examination shows that only the non-trivial and the ones which are multiply with –j, need to be changed. Moreover, the non-trivial multipliers are all that is necessary for implementation of the trivial multipliers needed for Walsh spreading/despreading, with the ability to change between FFT↔IFFT and multiply with −j. The only extra requirement for the hardware is in a controller for managing and controlling the operation of the processor.

The "Radix 4" Walsh spreading/despreading butterfly can be also represented as a matrix operation as shown below:

$$\begin{pmatrix} Y(1) \\ Y(2) \\ Y(3) \\ Y(4) \end{pmatrix} = \begin{pmatrix} 1 & 1 & 1 & 1 \\ 1 & -1 & 1 & -1 \\ 1 & 1 & -1 & -1 \\ 1 & -1 & -1 & 1 \end{pmatrix} \times \begin{pmatrix} X(1) \\ X(2) \\ X(3) \\ X(4) \end{pmatrix} \quad (6)$$

One can see the relation between the two transforms by comparing the two matrix presentations:

$$\text{Walsh} \begin{pmatrix} 1 & 1 & 1 & 1 \\ 1 & -1 & 1 & -1 \\ 1 & 1 & -1 & -1 \\ 1 & -1 & -1 & 1 \end{pmatrix} \Leftrightarrow \begin{pmatrix} 1 & 1 & 1 & 1 \\ 1 & -j & -1 & j \\ 1 & -1 & 1 & -1 \\ 1 & j & -1 & -j \end{pmatrix} FFT \quad (7)$$

Since the radix-4 transform is a complex operation, one gets two independent Walsh spreading/despreading processes for real vectors spreading/despreading (since the trivial multipliers by ±1 do not interchange between the I and the Q signals). This aspect is useful in implementing a two fingers' RAKE receiver or a complex Walsh Spreading/De-spreading processor as is provided for in the new WCDMA standards. One can also use the second independent Walsh spreading/despreading processor as extra stages and use them for greater Walsh spreading/despreading by conjured I and Q at the proper place (this possibility can easily be implemented in the reconfigurable Radix $2_2$ architecture).

The implementation presented in FIG. 17 requires only N Log(N) operations, and is very efficient for CDMA modulation/demodulation of several codes together, i.e., for a heavy data load.

The complex multipliers now can be used for implementing such configurations as filters in the frequency domain for randomizing/de-randomizing the Walsh sequence with quasi-random sequences with very high efficiency (when dealing with CDMA modulation/demodulation of several codes together, i.e. for a heavy data load (as can be seen in CDMA/WCDMA standards). The efficiency is achieved due to the fact that one needs to multiply the modulated data only once (for all the codes), and not every code is multiplied separately.

FIG. 15 presents a transformation of radix-4 stage to a Walsh spreading/de-spreading function when Twiddle multipliers for randomizing the Walsh codes are needed (beginning/end) in a parallel architecture. For the example of a Radix-2 based FFT, the twiddle multipliers need to be changed to "1"s only. The example of 16 chips' Walsh spreading/despreading sequences for modulation/demodulation processing is shown in FIG. 16. The complex multipliers can be used as explained above, e.g. for implementing filters in the frequency domain, or for randomization/de-randomization of the Walsh sequences with quasi-random sequences. The efficiency is achieved due to the fact that one needs to multiply the modulated data only once (for all the codes). Each code is not required to be multiplied separately.

Figure 18:
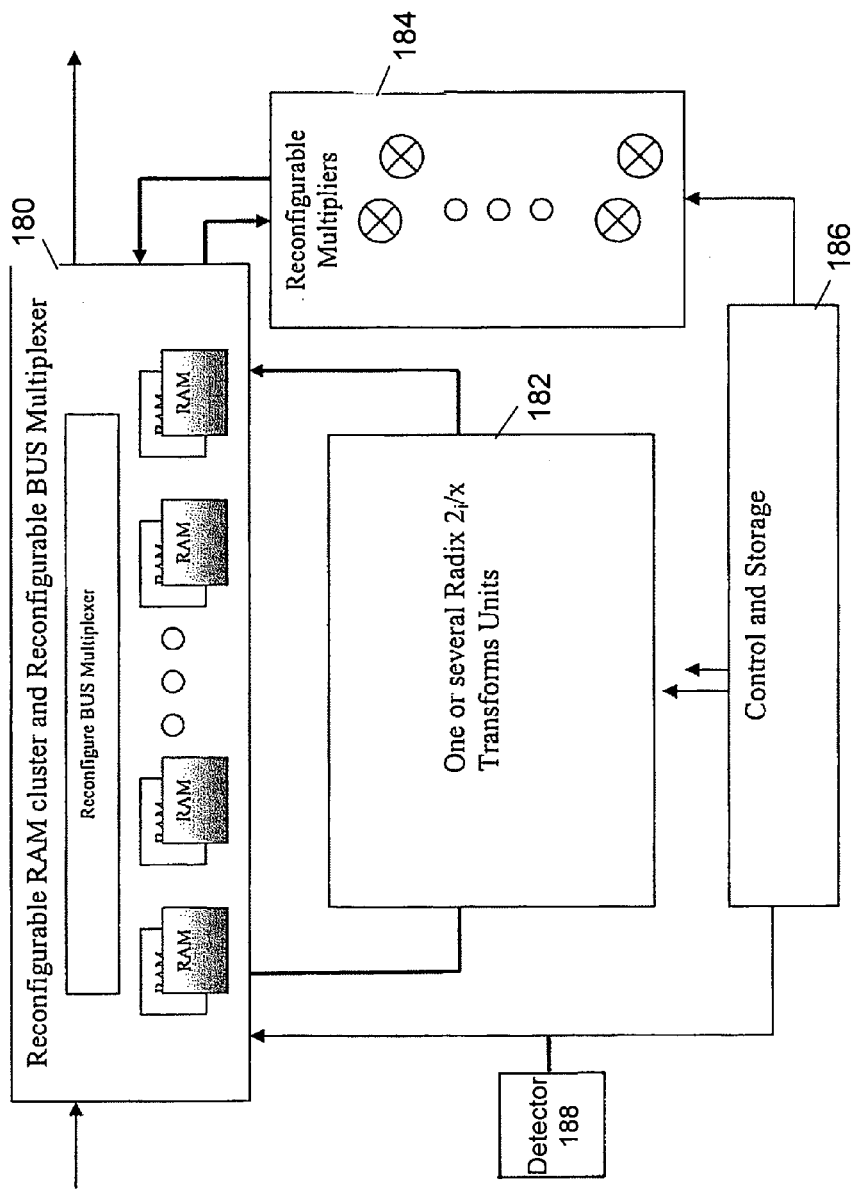
FIG. 18 is an illustration of a block diagram of an architecture of providing a reconfigurable MF-I core processor in accordance with one aspect of the method and system of the present disclosure.

Reconfigurable Hybrid Pipeline Column Multiplex Approach:

Finally, the general architecture of the reconfigurable device for implementing the general orthogonal transforms is summarily shown in FIG. 18 for the case of Radix$2_i$/x butterfly transforms. The computation unit can be implemented by use of Radix2, Radix$2_2$, Radix$2_3$, Radix 4, Radix 8, etc, butterfly units. The device preferably comprises a reconfigurable RAM cluster and a reconfigurable BUS multiplexer block 180, computation unit 182 comprising one or more butterfly units, reconfigurable multipliers block 184, controlling and storage unit 186 and detector 188. At each stage of the transform the unit 186 modifies the coefficients of the multipliers in the butterfly units of 2 according to the transform (the corresponding coefficients may take on the values {−1, 1, j, −j}). The result of the operation by unit 182 is stored in the registers of the unit 180 (which is also controlled by unit 186). The size of the registers is changed from stage to stage. A part of the stored data is inserted into the reconfigurable multipliers block 184, data is multiplied by coefficients established by the controlling and storage unit 186, according to the stage and the algorithm. The result of the multiplication is stored in block 180. A multiplexer of block 180 is used for multiplexing the stored data. It will be evident that as few as one butterfly unit and one multiplexer can be used for each stage, and that the one butterfly unit and multiplier can be reused for each stage by simply reconfiguring the hardware.

A specific application of the foregoing is described in our co-pending application Ser. No. 11/071,340, filed Mar. 3, 2005 and entitled Low-Power Reconfigurable Architecture For Simultaneous Implementation Of Distinct Communication Standards, which is incorporated by reference. FIG. 18 shows a block diagram of a system described and claimed in this co-pending application.

Figure 19:
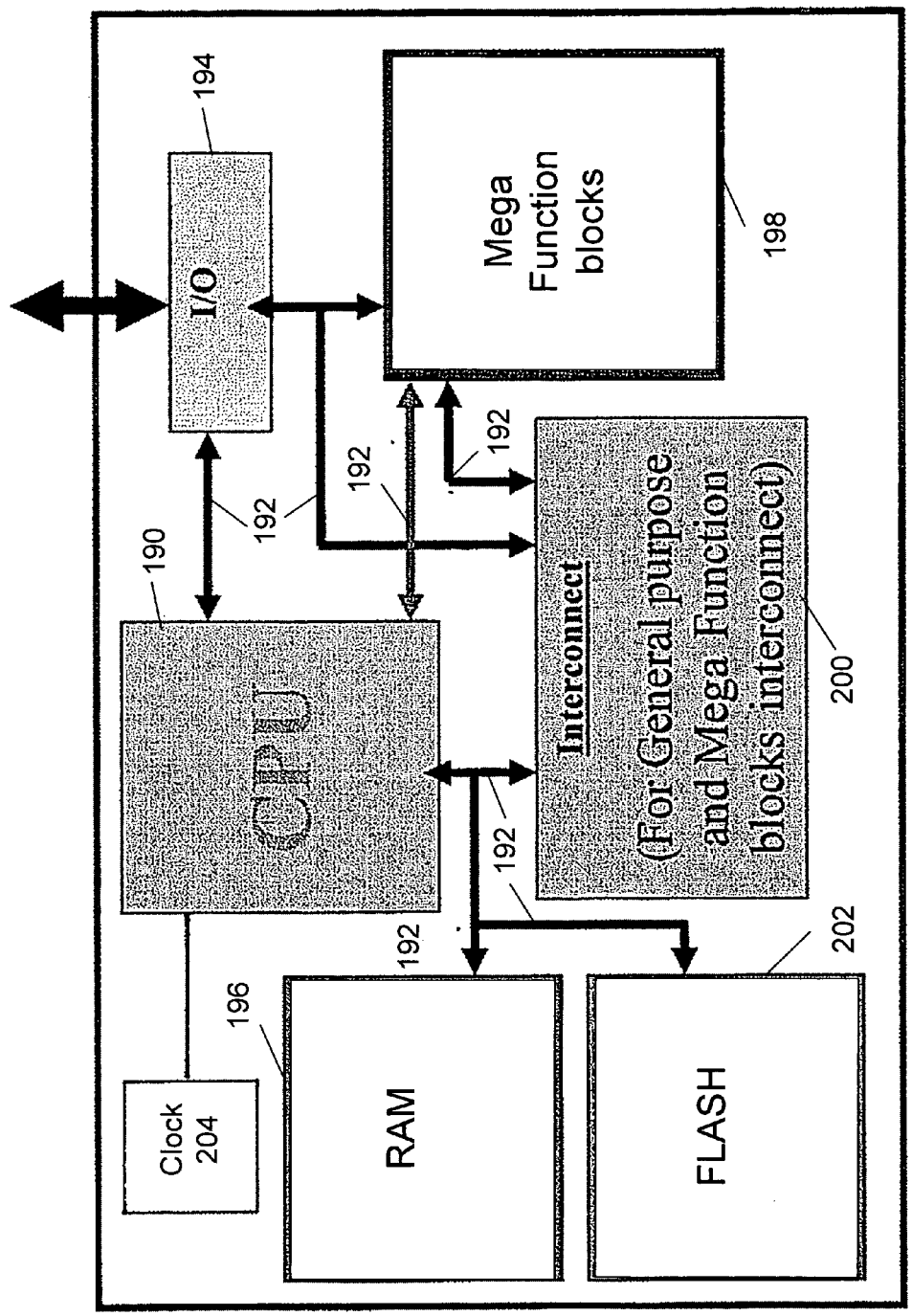
FIG. 19 is a block diagram of a communication system configured to comprise a transformer of any of the type described herein.

Accordingly, as illustrated in FIG. 19, an embodiment of an integrated chip made to comply with the foregoing chip architecture requirements will comprise the following basic functional components:

CPU 190 is preferably a relatively small computer processing unit needed for (a) controlling the configure part of the device i.e., net bus 192, I/O block 194, RAM block 196, megafunction block(s) 198, interconnect block 200, flash memory block 202 and clock 204; and (b) fixing the configuration of the megafunctions block(s) 198, as well as the bus 192, I/O block 194, RAM block 196, interconnect block 200, flash memory block 202 and clock 204, depending upon the protocol of the signals be processed by the chip. CPU 190 can also help by computing minor and simple assignments or tasks, and configuring the bus that is used to interconnect the megafunctions and the I/O block.

The net bus 192 is reconfigurable depending on the protocol. I/O block 194 is preferably a configurable I/O block that connects the chip with the outside world. Its tasks include receiving the "compiled software" of the application algorithm, and receiving input data and delivering output-processed data. RAM 196 is a random access memory preferably configured to store the "compiled software instructions", and to cache and buffer data. Megafunctions block 198 is preferably configured to include the major application functions of two or more applications, i.e., protocols, which are processed by computing each domain of the application functions as one function with extraordinary efficiency. In the present case, the megafunction block 198 is configured to include one or more of the orthogonal transforms, or any combination thereof, described herein. Interconnect block 200 preferably includes the reconfigurable net bus, which connects all the components of the chip including the CPU 190, I/O block 194, RAM 196, Megafunctions block 198, and Flash Memory 202 and Clock block 204. The interconnect block can also be configured to perform minor and simple assignments or tasks, preferably in extra memory. Finally, flash memory 200 preferably serves to store data as the chip runs through its programs. Flash memory is preferably in the form of EEPROM that allows multiple memory locations to be erased or written in one programming operation, so that it can operate at higher effective speeds when the systems using it read and write to different locations at the same time. It should be appreciated that for less complex operations, other types of memory could be used. Information is preferably stored in the flash memory by storing the information on a silicon chip in a way that does not need power to maintain the information in the chip. Consequently, power to the chip can be withdrawn and the information retained in flash memory without consuming any power. In addition, flash memory offers fast read access times and solid-state shock resistance, making flash memory particularly desirable in applications such as data storage on battery-powered devices like cellular phones and PDAs.

The architecture thus described, thus can be implemented as an integrated circuit. The architecture is believed adaptable for any type of orthogonal signaling, in which the vectors can vary in size (both real and complex vectors). Such orthogonal signaling can contain, but not restricted to FFT transforms, inverse FFT transforms (IFFT) or any its sub-product like Discrete Cosine/Sine Transforms (DCT and DST), Walsh-Hadamard transforms or any its sub-product like CDMA DSSS Spreading/De-spreading, and any algorithm which is a combination of two or more of these algorithms, and such other functionality, for example, filtering by using concatenation of FFT and IFFT transforms, which can be used also for equalization, Hilbert transforms, predictions, interpolations, correlations, etc.

The architecture of the present disclosure as disclosed herein, and all elements thereof, are contained within the scope of at least one of the following claims. No elements of the presently disclosed chip architecture are meant to be disclaimed, nor are they intended to necessarily restrict the interpretation of the claims.

What is claimed is:

1. A reconfigurable architecture for performing a fast orthogonal transform of vectors in multiple stages, the size of a vector being defined by N-points, wherein N can vary and the number of stages is a function of N, the architecture comprising:
   a computational unit configured and arranged so as to include only one or more butterfly units;
   a block including one or more multipliers coupled to the output of the computational unit, and an adder; configured and arranged so as to perform all of the butterfly computations for at least one stage of the transform;
   a storage unit configured and arranged so as to store the intermediate results of the butterfly computations and predetermined coefficients for use by the computational unit for performing each butterfly computation, the storage unit including memory and multiplexing architecture;
   a multiplexer unit configured and arranged so as to time multiplex all of the butterfly computations of the transform using said computation unit for the one stage so that only one computation unit is required for the stage; and
   a controller configured and arranged so as to provide coefficients to the computational unit, configure the architecture for processing data in time and space depending on the format of the data, and control the sizes of memory and multiplexing architecture in the, wherein the sizes of the memory are a function of the stage of the transform;
   wherein the multipliers' coefficients, the coefficients of the computational unit, the sizes of memories, and multiplexing architecture, for each stage are modified as a function of the value of N; and the architecture is reconfigurable so as to perform the fast orthogonal transform in accordance with any one of a plurality of transform formats including fast Fourier transforms (FFTs) of different radixes and fast Walsh orthogonal transforms, including, inverse FFT transforms (IFFT), any sub-products including Discrete Cosine/Sine Transforms including DCT and DST, Walsh-Hadamard transforms, and any sub-product including CDMA DSSS Spreading/De-spreading, and any algorithm including a combination of two or more of the foregoing transforms, and other functionality including filtering by using concatenation of FFT and IFFT transforms, Hilbert transforms, predictions, interpolations and correlations.

2. A reconfigurable architecture according to claim 1, wherein the butterfly units are configured in one of the following architectures: Radix2, $Radix2_2$, $Radix2_3$, Radix 4, or Radix 8.

2. A reconfigurable architecture according to claim 1, wherein the adder includes a shift register coupled to the butterfly unit so as to provide a single-path delay feedback.

3. A reconfigurable architecture according to claim 1, wherein the memory registers are FIFO shift registers.

4. A reconfigurable architecture according to claim 1, wherein the length of the memory registers are a function of the stage of the transform.

5. A reconfigurable architecture according to claim 1, wherein the length of the memory registers decreases with each successive stage.

6. A reconfigurable architecture according to claim 5, wherein the length of the memory registers is adjusted for each stage as a function of the value of N.

7. A reconfigurable architecture according to claim 6, wherein the multiplexer unit includes an input/output block to the computational unit.

8. A reconfigurable architecture according to claim 1, wherein N varies within a predefined range, further including a clock unit configured and arranged so as to provide a clocking frequency at the input sample rate for the entire predefined range.

9. A reconfigurable architecture according to claim 8, wherein the architecture includes multiple computational units arranged as hardware so that the entire predefined range M is accommodated by mapping the transform of predefined range on the hardware, and disabling those computational units that are unnecessary when the transform is less than M.

10. A reconfigurable architecture according to claim 8, wherein the architecture includes multiple computational units arranged as hardware so that less "m" than the entire predefined range M is accommodated, and the stages are at least partially shared hardware for transforms greater that "m".

11. A reconfigurable architecture according to claim 1, wherein each stage requires N/2 computations.

12. A reconfigurable architecture according to claim 1, further including a plurality of computational units, one for each of said stages, and said computational units are implemented so as to provide a pipelined architecture.

13. A reconfigurable architecture according to claim 1, further including a plurality of computational units, one for each of said stages, and said computational units are implemented so as to provide an architecture configured in one or more of the following types: pipelined, iterative and parallel.

14. A reconfigurable architecture according to claim 1, wherein a full frame of said transform is implemented in N clock cycles.

15. A reconfigurable architecture according to claim 1, wherein the butterfly unit includes a Radix 2 architecture.

16. A reconfigurable architecture according to claim 1, wherein the butterfly unit includes a Radix 4 architecture.

17. A reconfigurable architecture according to claim 16, wherein a full frame of said transform is implemented in N/2 clock cycles.

18. A reconfigurable architecture according to claim 1, further including a transform accelerator, wherein the accelerator includes the computational unit, storage unit, and multiplexer unit, wherein the accelerator is configured and arranged to perform each butterfly computation for all of the stages in an iterative process.

19. A reconfigurable architecture according to claim 1, wherein the storage unit is configured and arranged to include filter coefficients, and the multiplier of the computational unit of the last stage of the transform is adapted to multiply the output of the last stage by one or more of the filter coefficients so as to produce a filtered output.

20. A reconfigurable architecture according to claim 19, wherein the filtered output is applied to the input of multiple stages of a transform that is the inverse of the orthogonal transform, wherein each of the stages includes a computation unit and said units form a pipelined architecture.

21. A reconfigurable architecture according to claim 1, wherein the vectors include both real and complex vectors.

22. An integrated chip comprising a reconfigurable architecture for performing a fast orthogonal transform of vectors in multiple stages, the size of a vector being defined by N-points, wherein N can vary and the number of stages is a function of N, the architecture comprising:
  a computational unit configured and arranged so as to include only one or more butterfly units;
  a block including one or more multipliers coupled to the output of the computational unit, configured and arranged so as to perform all of the butterfly computations for at least one stage of the transform;
  a storage unit configured and arranged so as to store the intermediate results of the butterfly computations and predetermined coefficients for use by the computational unit for performing each butterfly computation, the storage unit including memory and multiplexing architecture;
  the storage unit including memory and multiplexing architecture;
  a multiplexer unit configured and arranged so as to time multiplex all of the butterfly computations of the transform using said computation unit for the one stage so that only one computation unit is required for the stage; and
  a controller configured and arranged so as to configure the architecture for processing data in time and space depending on the format of the data, provide coefficients to the computational unit, and control the sizes of memory and multiplexing architecture in the storage unit, wherein the sizes of the memory are a function of the stage of the transform;
  wherein the multipliers' coefficients, the coefficients of the computational unit, the sizes of memories, and multiplexing architecture, for each stage are modified as a function of the value of N, and the architecture is reconfigurable so as to perform the fast orthogonal transform in accordance with any one of a plurality of transform formats including fast Fourier transforms of different radixes and fast Walsh orthogonal transforms, inverse FFT transforms (IFFT), any sub-products including Discrete Cosine/Sine Transforms including DCT and DST, Walsh-Hadamard transforms, and any sub-product including CDMA DSSS Spreading /De-spreading, and any algorithm including a combination of two or more of the foregoing transforms, and other functionality including filtering by using concatenation of FFT and IFFT transforms, Hilbert transforms, predictions, interpolations and correlations.

23. A communication system including the integrated chip of claim 22.

24. A communication system according to claim 23, further comprising a detector for determining the size of the vector.

25. A method of performing any one of a plurality of fast orthogonal transforms of vectors in multiple stages in accordance with any one of plurality of transform formats including fast Fourier transforms of different radixes and fast Walsh orthogonal transforms, including FFTs, inverse FFT transforms (IFFT), any sub-products including Discrete Cosine/Sine Transforms including DCT and DST, Walsh-Hadamard transforms, and any sub-product including CDMA DSSS Spreading/De-spreading, and any algorithm including a combination of two or more of the foregoing transforms, and other functionality including filtering by using concatenation of FFT and IFFT transforms, Hilbert transforms, predictions, interpolations and correlations, the size of a vector being defined by N-points, wherein N can vary and the number of stages is a function of N, the method comprising:
  choosing a fast transform format and carrying out the following steps in accordance with that format;
  configuring and arranging a computational unit in order to process data in time and space depending on the format of the data so as to include only one or more butterfly units as a function of the format; a block so as to include one or more multipliers coupled to the output of the computational unit, configuring and arranging the one or more butterfly units and one or more multipliers so as to perform all of the butterfly computations for at least one stage of the transform;
  storing the intermediate results of the butterfly computations and predetermined coefficients in a storage unit for use by the computational unit for performing each butterfly computation, the storage unit including memory and multiplexing architecture;
  time multiplexing all of the butterfly computations of the transform using the computation unit for the one stage so that only one computation unit is required for the stage; and
  providing coefficients to the computational unit, and controlling the sizes of memory and multiplexing architecture in the, wherein the sizes of the memories are a function of the stage of the transform;
  wherein the multipliers' coefficients, the coefficients of the computational unit, the sizes of memories, and multiplexing architecture, for each stage are modified as a function of the value of N.

26. A method of performing a fast orthogonal transform of vectors in multiple stages in accordance with any one of a plurality of fast transform formats, including fast Fourier transforms of different radixes and fast Walsh orthogonal transforms, including FFTs, inverse FFT transforms (IFFT), any sub-products including Discrete Cosine/Sine Transforms including DCT and DST, Walsh-Hadamard transforms, and any sub-product including CDMA DSSS Spreading/De-spreading, and any algorithm including a combination of two or more of the foregoing transforms, and other functionality including filtering by using concatenation of FFT and IFFT transforms, Hilbert transforms, predictions, interpolations and correlations, the size of a vector being defined by N-points, wherein N can vary and the number of stages is a function of N, the method comprising:

choosing a fast transform format and carrying out the following steps in accordance with that format;

utilizing a reconfigurable group of butterfly units and a reconfigurable set of multipliers configured and arranged so as to process data in time and space as a function of the format of the data so that at least one computational unit can be configured and arranged to include at least only one butterfly unit and a multiplier coupled to the output of the butterfly unit so that the computational unit can perform all of the butterfly computations for at least one stage of the transform, and reconfigurable memory coupled to the computational unit so as to store the intermediate results of the butterfly computations and predetermined coefficients for use in performing each butterfly computation;

wherein coefficients and sizes of memories, for each stage are modified as a function of the value of N, and the sizes of the memories are a function of the stage of the transform.

27. A system of performing a fast orthogonal transform of vectors in multiple stages in accordance with any one of a plurality of fast transform formats, including fast Fourier transforms of different radixes and fast Walsh orthogonal transforms, including FFTs, inverse FFT transforms (IFFT), any sub-products including Discrete Cosine/Sine Transforms including DCT and DST, Walsh-Hadamard transforms, and any sub-product including CDMA DSSS Spreading/Despreading, and any algorithm including a combination of two or more of the foregoing transforms, and other functionality including filtering by using concatenation of FFT and IFFT transforms, Hilbert transforms, predictions, interpolations and correlations, the size of a vector being defined by N-points, wherein N can vary and the number of stages is a function of N, the method comprising:

choosing a fast transform format and carrying out the following steps in accordance with that format;

a reconfigurable group of butterfly units and a reconfigurable set of multipliers configured and arranged so as to process data in time and space as a function of the format of the data so that at least one computational unit can be configured and arranged to include at least only one butterfly unit and a multiplier coupled to the output of the butterfly unit so that the computational unit can perform all of the butterfly computations for at least one stage of the transform, and reconfigurable memory coupled to the computational unit so as to store the intermediate results of the butterfly computations and predetermined coefficients for use in performing each butterfly computation;

wherein coefficients and sizes of memories, for each stage are modified as a function of the value of N, and the sizes of the memories are a function of the stage of the transform.

\* \* \* \* \*